United States Patent
Lesea

(10) Patent No.: US 8,773,929 B1
(45) Date of Patent: Jul. 8, 2014

(54) SINGLE-EVENT-UPSET RESISTANT MEMORY CELL WITH TRIPLE WELL

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 1425 days.

(21) Appl. No.: 12/045,864

(22) Filed: Mar. 11, 2008

(51) Int. Cl.
- G11C 11/412 (2006.01)
- G11C 11/413 (2006.01)
- G11C 11/419 (2006.01)
- H01L 27/11 (2006.01)

(52) U.S. Cl.
USPC .......................................... 365/200; 365/154

(58) Field of Classification Search
None
See application file for complete search history.

(56) References Cited

U.S. PATENT DOCUMENTS

| | | |
|---|---|---|
| 5,570,313 A | 10/1996 | Masson et al. |
| 5,889,315 A | 3/1999 | Farrenkopf et al. |
| 6,727,573 B2 | 4/2004 | Mitani et al. |
| 6,735,110 B1 | 5/2004 | Lesea |
| 6,809,957 B2 | 10/2004 | Lesea |
| 6,914,804 B2 | 7/2005 | Lesea |
| 7,139,190 B1 | 11/2006 | de Jong |
| 7,236,000 B1 | 6/2007 | Steiner |
| 7,268,400 B2 | 9/2007 | Cecchi et al. |
| 7,271,452 B2 * | 9/2007 | Arai ............................... 257/371 |
| 7,298,168 B1 | 11/2007 | Steiner |
| 7,515,452 B1 | 4/2009 | de Jong et al. |
| 2003/0151956 A1 * | 8/2003 | Marr et al. ................ 365/189.09 |
| 2006/0056220 A1 | 3/2006 | Roche et al. |
| 2006/0086989 A1 * | 4/2006 | Lee et al. ........................ 257/371 |
| 2007/0013425 A1 * | 1/2007 | Burr et al. ...................... 327/208 |

OTHER PUBLICATIONS

U.S. Appl. No. 11/649,447, filed Jan. 3, 2007, de Jong et al.
U.S. Appl. No. 11/649,448, filed Jan. 3, 2007, de Jong et al.
Rizzo, Giuliana, "R&D on silicon pixels and strips," overhead slides, SuperB WorkShop, Nov. 17, 2006, pp. 1-17, Frascati National Laboratories, Frascati, Rome.
Rossi, Roberto et al., "Model and Verification of Triple-Well Shielding on Substrate Noise in Mixed-Signal CMOS ICs," Proceedings of the 29$^{th}$ European Solid-State Circuits Conference (ESSCIRC '03), Sep. 16, 2003, pp. 643-646, Estoril, Portugal.

(Continued)

*Primary Examiner* — Hoai V Ho
*Assistant Examiner* — James G Norman
(74) *Attorney, Agent, or Firm* — Scott Hewett; LeRoy D. Maunu; Lois D. Cartier

(57) ABSTRACT

A memory cell (300) having a plurality of transistors connected so as to restore a data value to a node of the memory cell to an initial value following an event upsetting the initial value. A first transistor (306) of a first type is in a first well (334) of a second type having a first well tap (342). A second transistor (308) of the first type is in a second well (336) of the second type having a second well tap (344). A third transistor (310) of the second type is in a third well (338) of the first type having a third well tap (346); and a fourth transistor (312) of the second type is in a fourth well (340) of the first type having a fourth well tap (348). The first well, second well, third well, and forth well are isolated from each of the other wells.

19 Claims, 5 Drawing Sheets

(56) References Cited

OTHER PUBLICATIONS

Zhang, Ming et al., "Design of Soft Error Tolerant Logic Circuits," Proceedings of the Workshop on System Effects of Soft Logic Errors (SELSE), Apr. 5, 2005, pp. 1-4, Univ. of Illinois, Urbana-Champaign, IL.

Velazco, R. et al., "Two CMOS Memory Cells Suitable for the Design of SEU-Tolerant VLSI Circuits," IEEE Transactions on Nuclear Science, Dec. 1994, pp. 2229-2234, vol. 41, No. 6.
U.S. Appl. No. 11/900,549, filed Sep. 11, 2007, Lesea.
U.S. Appl. No. 12/354,202, filed Jan. 15, 2009, de Jong.
U.S. Appl. No. 12/558,770, filed Sep. 14, 2009, Lesea.

* cited by examiner

US 8,773,929 B1

SINGLE-EVENT-UPSET RESISTANT MEMORY CELL WITH TRIPLE WELL

FIELD OF THE INVENTION

This invention relates generally to complementary metal-oxide-semiconductor ("CMOS") memory cells, and more particularly to memory cells tolerant to high energy particle ("ion") hits.

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

PLDs and other ICs that are specialized to be radiation tolerant are desirable for certain applications. Such ICs are often referred to as single event upset (SEU) tolerant ICs, heavy ion tolerant (HIT) ICs or radiation-hardened ICs. An SEU arises when a heavy ion or high-energy particle, such as an alpha particle or neutron, hits a memory cell, charging internal nodes of the memory cell that can change the memory state. For convenience of discussion, an SEU will be referred to as an "ion hit," whether it involves an ion or other high-energy particle causing the error.

Various approaches have been tried to improve SEU tolerance. One approach is commonly called "resistive hardening;" however, resistive hardening can significantly degrade latch performance. Another disadvantage arises if a standard CMOS fabrication has to be modified to accommodate a resistively hardened IC. It is highly desirable that SEU tolerant ICs be made using standard CMOS fabrication processes.

Another approach to improve SEU tolerance is commonly called "design hardening." Design hardening generally refers to laying out a memory cell or other circuit to improve recovery of data after ion hits. A general discussion of design hardening is found in the paper entitled "Two CMOS Memory Cells Suitable for the Design of SEU-Tolerant VLSI Circuits," by Velazco et al., *IEEE Transactions on Nuclear Science*, Vol. 41, No. 6 (December 1994), the disclosure of which is hereby incorporated by reference for all purposes.

In design hardening, redundant storage bits are located apart from each other, maintaining a source of initial data after an SEU upsets one of the storage bits. Many variations are known, using sixteen-, fourteen- and twelve-transistor SEU tolerant memory cells.

FIG. 1 is a circuit diagram of a prior art twelve-transistor SEU tolerant memory cell 150. As used herein, "twelve-transistor memory cell" refers to both the storage devices N1, N2, N3, N4, P1, P2, P3, P4 and the access devices T1, T2, T3, T4. Those of skill in the art of SEU resistant memory cells appreciate that the number of access devices is not always included in the transistor count or shown in the memory cell circuit diagram. The operation of the memory cell 150 will be familiar to those of skill in the art. A detailed description of a similar SEU resistant memory cell is described in U.S. Pat. No. 5,570,313 by Masson et al. and in U.S. Patent Application No. 2006/0056220 A1 by Roche et al., the disclosures of which are incorporated herein by reference for all purposes. A detailed description of the electrical operation of the circuit is therefore omitted.

The memory cell circuit 150 has data terminals d, $d_b$ ("data BAR"), output terminals Q, $QQ_b$, and internal nodes 152, 154 that store values $Q_b$ and QQ, respectively. A data value is a digital zero or digital one value, and the bar value is the opposite value. For example, if Q=1, then $Q_b$=0. QQ saves a redundant value of Q, and $QQ_b$ saves a redundant value of $Q_b$. The values stored at the nodes are utilized in restoring the state of the memory cell if a node is upset by an SEU.

Since QQ has the same value of Q, and $QQ_b$ has the same value of $Q_b$, other nodes could be used for the outputs of the memory cell 150. For example, instead of Q and $QQ_b$ being the nodes that are output, as shown in FIG. 1, the outputs could be nodes QQ and $QQ_b$, nodes Q and $Q_b$, or nodes QQ and $Q_b$. Furthermore, in a memory array having several similar memory cells defined in the silicon layer, some memory cells in the array may interface to other portions (circuits) of an IC through nodes Q and $Q_b$, and other memory cells may interface to other portions or the IC through nodes QQ and $Q_b$, for example.

Redundant data storage nodes are used for storing information. If data stored in one node is changed by an ion hit, the redundant node restores the other node to its initial value (state). This protects the data stored in the memory cell from ion hits as long as the data values stored in both of the redundant nodes are not simultaneously changed by an ion hit. It is desirable to physically separate redundant nodes to avoid both nodes from being affected by a single ion hit.

An ion hit creates charge in the silicon of the memory cell. This charge can upset the data value stored at a node by changing the voltage at that node. As the devices used in memory cells shrink, the amount of charge required to upset a stored data value also decreases. Charge is generated about a radius of the path of the ion. Although this charge radius depends on the energy of the ion, it is generally desirable to separate redundant nodes in SEU tolerant memory cells by at least one micron.

As the design technology decreases for IC production, simply separating redundant nodes may not provide sufficient SEU tolerance. Even when redundant nodes in SEU tolerant memory cells are separated by at least one micron, higher energy ions might upset the data value stored in a memory cell.

Therefore, memory cells providing improved SEU tolerance are desirable.

SUMMARY OF THE INVENTION

A memory cell having a plurality of transistors connected so as to restore a data value to a node of the memory cell to an initial value following an event upsetting the initial value. A first transistor of a first type is in a first well of a second type having a first well tap. A second transistor of the first type is in a second well of the second type having a second well tap. A third transistor of the second type is in a third well of the first type having a third well tap; and a fourth transistor of the second type is in a fourth well of the first type having a fourth well tap. The first well, second well, third well, and forth well are isolated from each of the other wells.

DETAILED DESCRIPTION

An Exemplary FPGA

Figure 2:
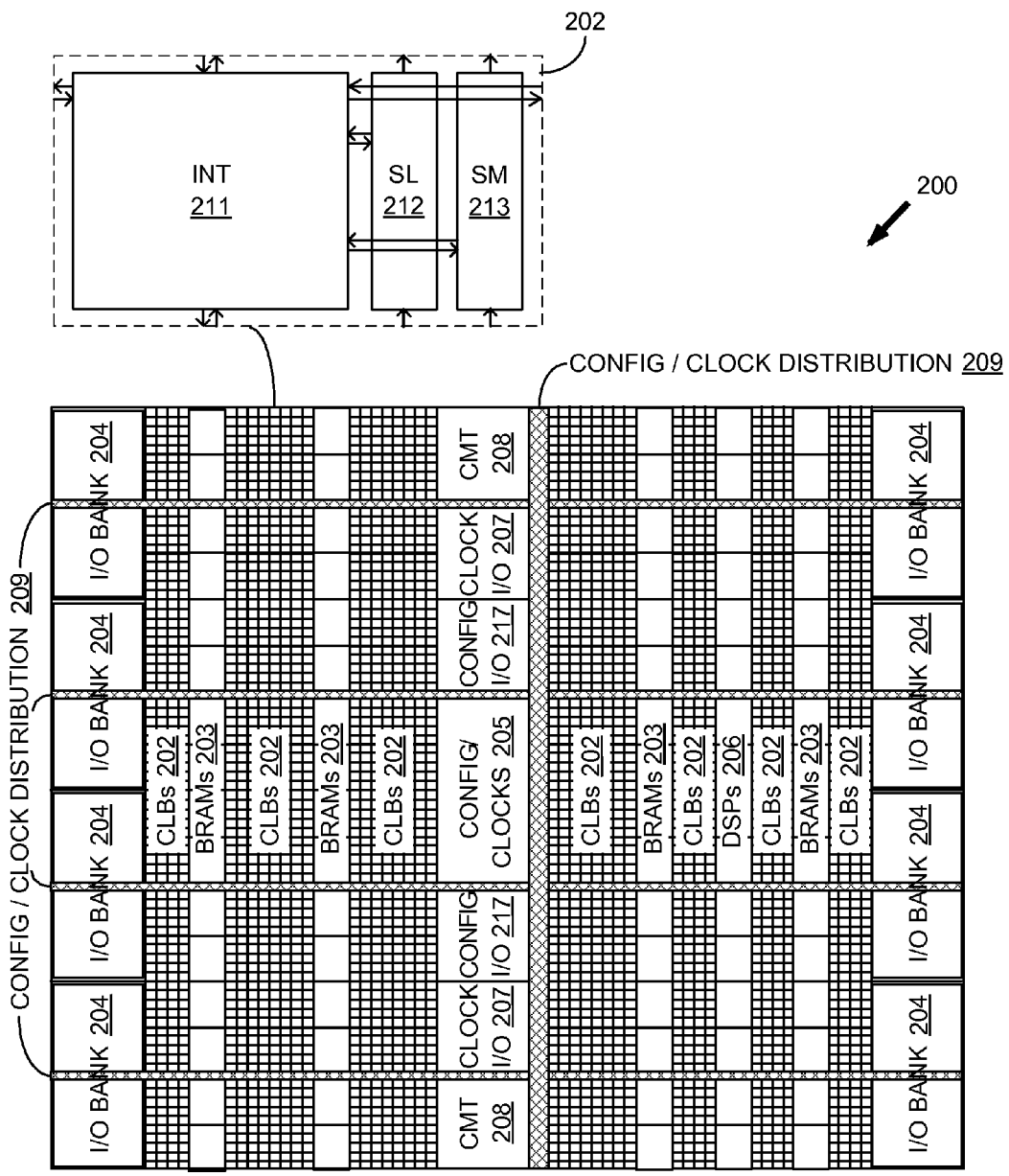
FIG. 2 is a plan view of an FPGA architecture suitable for implementing embodiments of the invention.

FIG. 2 illustrates an FPGA architecture 200 suitable for implementing embodiments of the invention. The FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/ logic implementations included at the top of FIG. 2 are purely exemplary. For example, in an actual FPGA more than one adjacent column of CLBs is typically included wherever the CLBs appear, to facilitate the efficient implementation of user logic.

Embodiments of the invention are incorporated in any of several portions of the FPGA 200. For example, SEU-tolerant memory cells and memory arrays are incorporated in BRAMs or configuration memory. Configuration memory is distributed throughout an FPGA and is generally present in numerous types of programmable blocks, such as CLBs and IOs. Some types of memory, such as block memory, use error code correction techniques, and are less susceptible to SEU errors.

Non-correcting, six-transistor memory cells are suitable for many applications in an FPGA.

The configuration memory cells in an FPGA are used to control the operation of other circuits. Within the FPGA, the memory cells are placed in columns, where there could be groups of 1, 2, or 3 columns separated by circuits controlled by the memory cells. Memory cell outputs can connect to the circuits using poly or metal layers.

Configuration memory is particularly susceptible to SEU because error code correction techniques cannot be used, and an error in configuration memory can change the functionality of a block in the FPGA. In a particular embodiment, the FPGA 200 is fabricated using multiple well techniques according to one or more embodiments. It is particularly challenging to provide SEU tolerant memory for small technology designs because as the design technology decreases, the separation between nodes of a memory cell decreases. The amount of charge needed to upset a data value stored at a node also typically decreases. Memory cells using multiple well techniques provide high SEU tolerance, even in small technology designs.

An Exemplary Memory Cell

Figure 1:
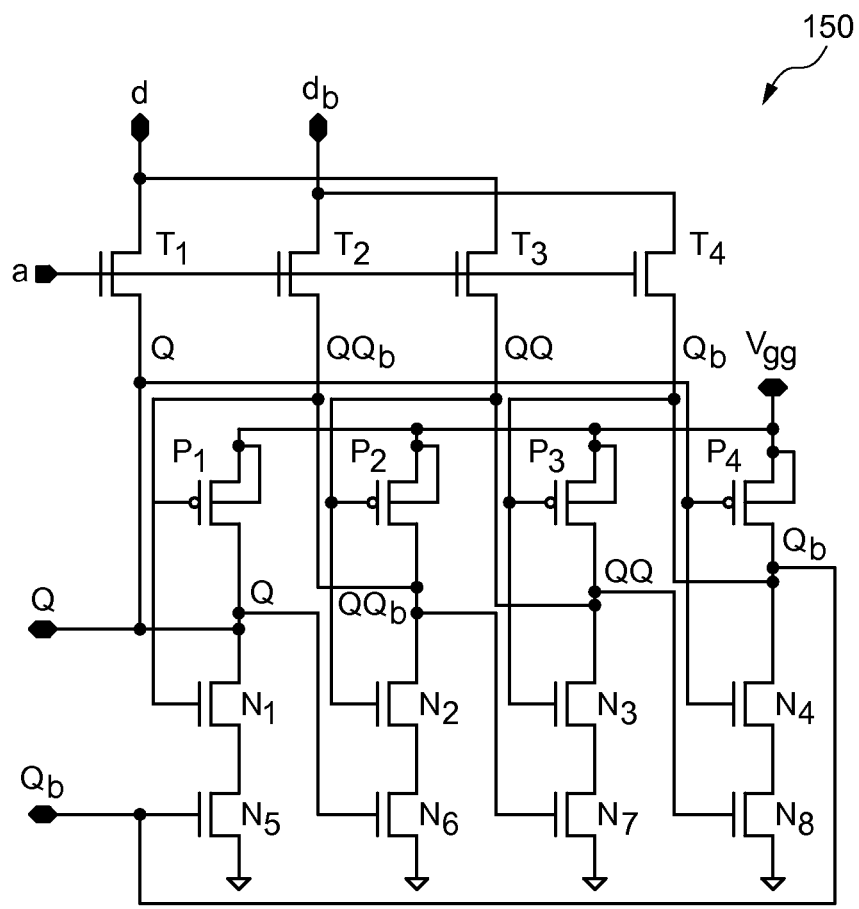
FIG. 1 is a circuit diagram of a prior art twelve-transistor SEU tolerant memory cell.
Figure 3A:
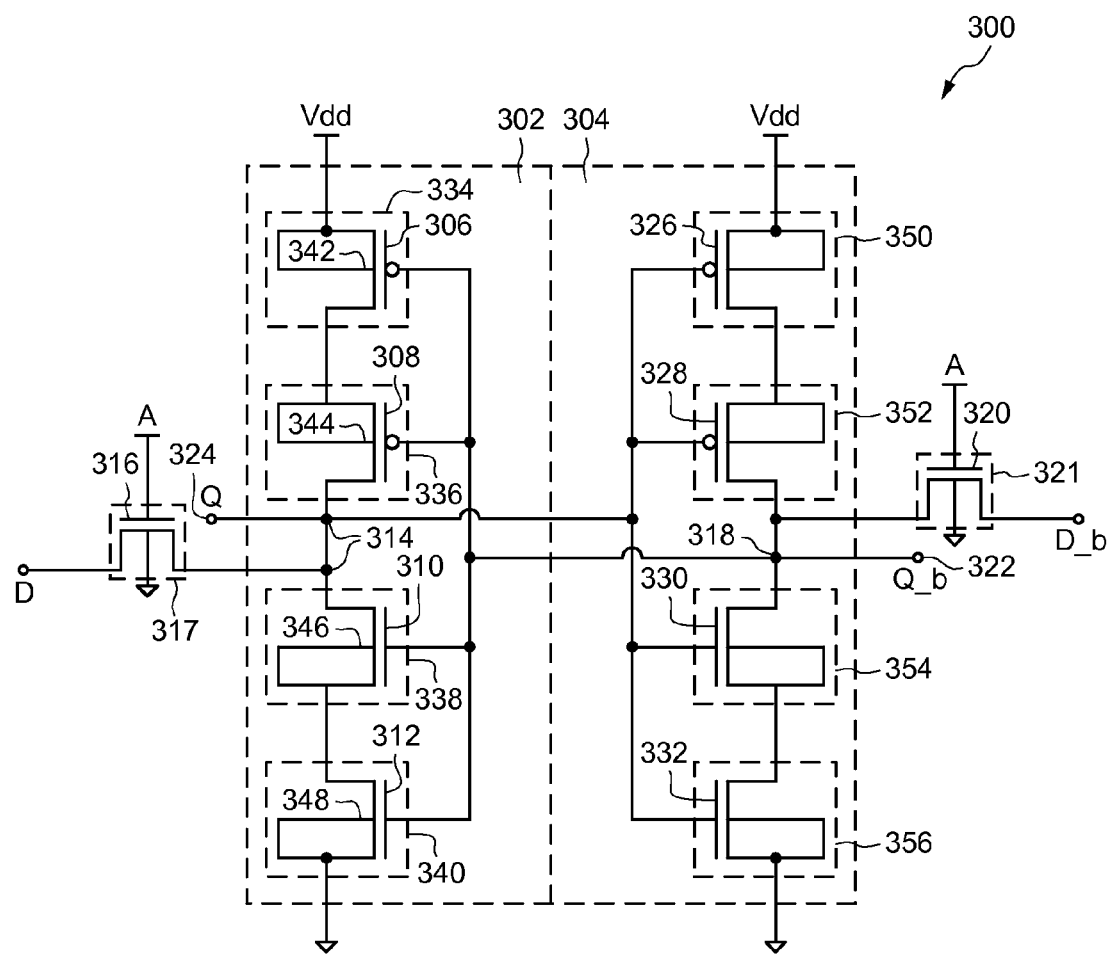
FIG. 3A is a layout of an SEU tolerant memory cell according to an embodiment of the invention.

FIG. 3A is a layout of an SEU-tolerant memory cell 300 according to an embodiment of the invention. The memory cell has a plurality of transistors connected so as to restore a data value (e.g., a digital "1" or a digital "0") to a node (e.g., Q) of the memory cell to an initial value following an event upsetting the initial value. The memory cell 300 has a first inverter 302 and a second inverter 304 that is cross-coupled to the first inverter 302 to provide redundant memory storage. The second inverter 304 operates similarly to the first inverter 302. For simplicity of discussion, only the operation of the first inverter will be described in detail, as operation of the second inverter and of the SEU-tolerant memory cell 300 will be familiar to those of skill in the art of SEU-tolerant memory, particularly in light of FIG. 1 and its associated description, above.

Figure 4:
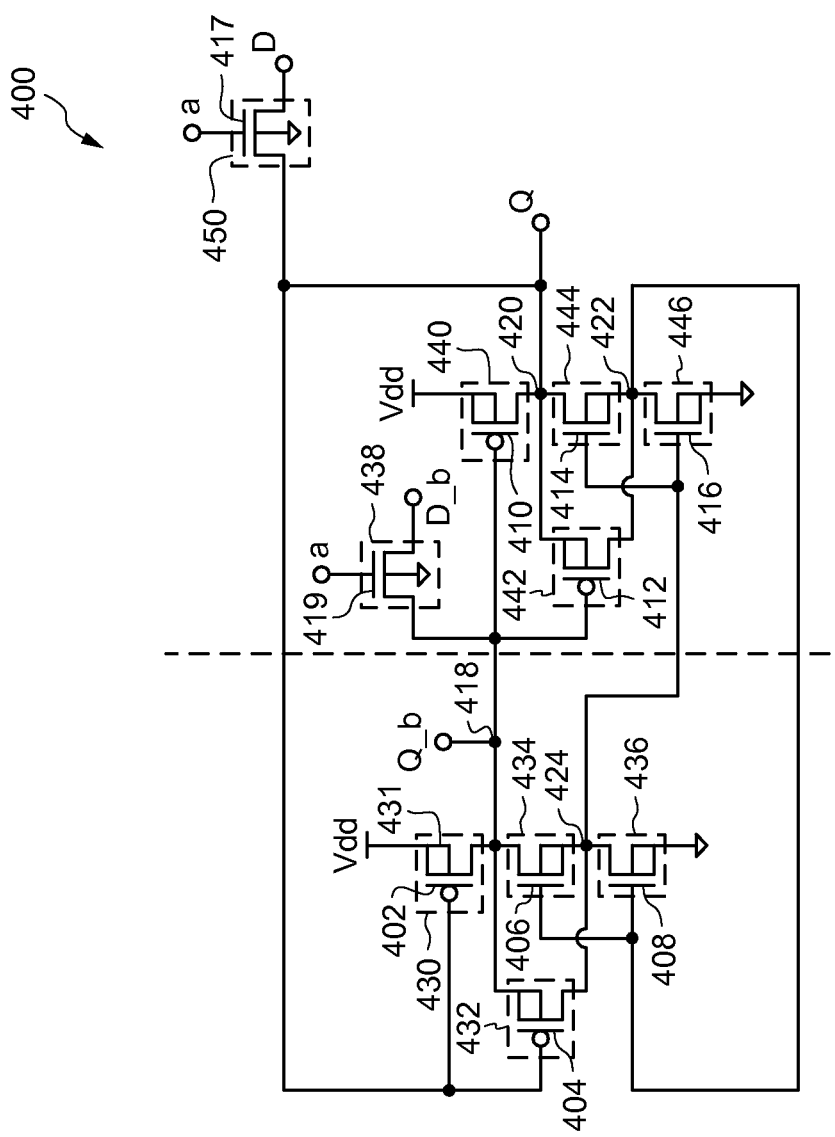
FIG. 4 is a layout of an SEU tolerant memory cell according to another embodiment of the invention.

The memory cell 300 typically forms a portion of a memory cell array 302 in an IC, such as in an FPGA. In a particular embodiment, memory cells are stepped in a repeated fashion to form a memory array having thousands of memory cells. The first inverter 302 has two transistors of a first type 306, 308 (e.g., PMOS transistors) in series and two transistors of a second type 310, 312 (e.g., NMOS transistors) in series. As used herein, "type" refers to the conductivity type, such as N-type or P-type semiconductor material, or PMOS or NMOS type transistors. FIG. 3A illustrates an embodiment having series transistors with separate wells with taps (compare, FIG. 4, illustrating an embodiment having series-parallel transistors with separate wells and taps.).

Data D is provided to a node 314 through a pass transistor 316. Similarly, inverse data ("data-bar") D_b is provided to a second node 318 through a second pass transistor 320. The second node 318 is connected to the gates of the four transistors 306, 308, 310, 312 in the first inverter 302, and the node 314 is connected to the gates of the four transistors in the second inverter 304. Thus, a data-bar value that turns the PMOS transistors 306, 308 ON will hold the NMOS transistors 310, 312 OFF, and vice versa. The data-bar value at node 318 is also the output-bar value Q_b at output node 322, and similarly, the data value D at node 314 is the same as the output value Q at output node 324. The transistors 306, 308, 310, and 312 are the transistors that are part of the cross-coupled inverters.

If the data-bar value turns on the PMOS transistors 306, 308, the node 314 will be coupled to Vdd through the PMOS transistors, providing a HIGH value at node 314. If the data-bar value turns the NMOS transistors 310, 312 ON, the node 314 will be coupled to ground through the NMOS transistors, providing a LOW value at node 314. The designations "HIGH" and "LOW" may indicate either a digital "1" or digital "0" according to the conventions of the circuit, as would be understood by one of skill in the art of digital circuit design.

The value at node 314 is coupled to the gates of the transistors 326, 328, 330, 332 of the second inverter 304, holding node 322 to the opposite digital data value of node 314, and vice versa. Thus, if output value Q is upset by a single event, it is restored to its original value by the output value Q_b in the second inverter.

Each of the storage transistors 306, 308, 310, 312 is fabricated in its own corresponding well 334, 336, 338, 340, and each of these wells have their own well taps 342, 344, 346, 348. Each well 334, 336, 338, 340 has at least one P-N junction between it and each other well in the memory cell 300. The transistors 326, 328, 330, 332 similarly have individual wells 350, 352, 354, 356 with similarly individual well taps.

If an upset event, such as a high-energy ion, creates charge in a well, the corresponding well tap draws the charge out of the well, and the P-N junction between wells prevents the generated charge from affecting another well. In other words, the charge created by upset event is confined to a single well until dissipated. The use of two PMOS transistors 306, 308 in series when the data state turns on the PMOS transistors 306, 308 (and the use of the corresponding two NMOS transistors 310, 312 for the opposite data state) holds the output Q to the correct value even when an upset event occurs at one of the PMOS transistors 306, 308.

For example, the well tap 342 of PMOS transistor 306 is connected to Vdd. If an upset event occurs at PMOS transistor 306, the generated charge is dissipated by Vdd. If the PMOS transistors 306, 308 are held ON by Q_b, the well 336 of PMOS transistor 308 is connected to Vdd through PMOS transistor 306. Charge generated by an upset event occurring at PMOS transistor 308 is dissipated by Vdd through PMOS transistor 306. The charge developed by the upset event at PMOS transistor 308 does not affect the operation of series PMOS transistor 306 because the P-N junction between wells 336 and 334 prevent charge generated by the upset event from flowing between well 336 and 334. The series PMOS transistor 306 maintains the conductive state to dissipate the charge in well 336 to Vdd.

The pass transistors 316, 320 are also fabricated in separate wells 317, 321 that form at least one P-N junction between a pass transistor and each other transistor in the memory cell. The P-N junction keeps charge generated by an upset event within the well until the generated charge is dissipated through ground. In alternative embodiments, pass transistors are fabricated in a common well with one or more transistors, or in the native semiconductor. An upset to an address transistor in effect activates it for a Q-write operation. If DATA and DATA-bar are held at ½ Vdd (typically), then an upset event at such an address transistor does not upset the data value of the memory cell.

The NMOS transistors 310, 312 in the first inverter 302 operate in a similar fashion when the NMOS transistors are held ON by Q_b. The operation of the second inverter 304 in response to an upset event(s) is also similar. Therefore, a detailed description of each pair of series transistors is omitted.

The wells 3334, 336, 338, 340 are fabricated using techniques commonly known as triple-well techniques. Many CMOS ICs use what is commonly known as a double-well technique, in which both N-wells and P-wells are formed in a semiconductor substrate (e.g., a silicon wafer). An example of a triple-well technique forms an N-well, a P-well, and a P-well inside an N-tub. An alternative example uses an N-well, a P-well, and an N-well inside a P-tub.

The term "triple-well" is used herein to generally describe well techniques using one or more tubs to electrically isolate the well portions of transistors from each other by forming intervening P-N junctions that block charge flow generated in a first well region from entering a second, typically adjacent, well region. In a particular embodiment, an IC having a memory cell uses both a P-well in an N-type tub and an N-well in a P-type tub. Such embodiments will also be referred to as using "triple-well" techniques.

An Exemplary Triple-Well Device

Figure 3B:
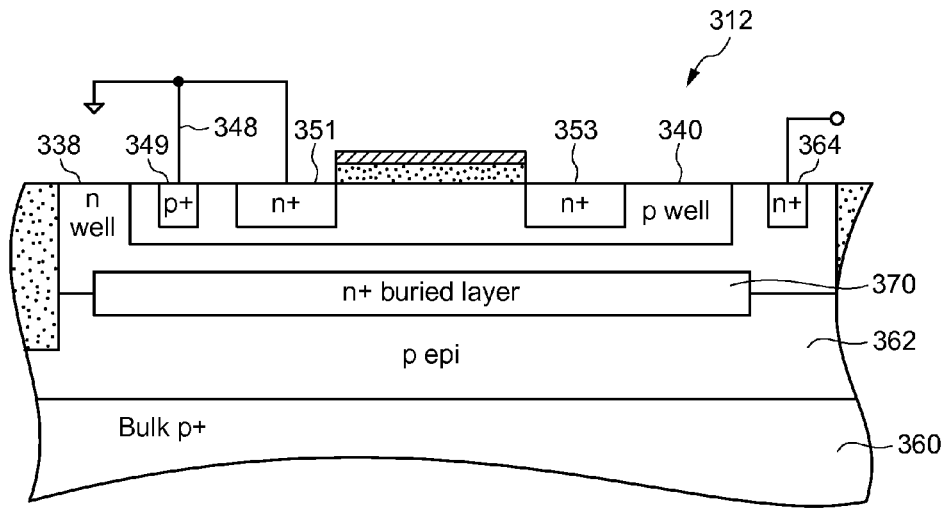
FIG. 3B shows a cross-section of a shielded NMOS device illustrating multiple wells used in a memory cell in accordance with and embodiment.

FIG. 3B shows a cross-section of a shielded NMOS device 312 illustrating multiple wells used in a memory cell in accordance with and embodiment. A shielded device is a device that is in its own well with its own tap, that is, no other devices (e.g., FETs) share that well. A similar shielded PMOS structure is known in the art, as are unshielded NMOS and PMOS triple well devices. Various combinations of shielded and unshielded triple-well techniques are used in various embodiments. The cross-section represents a section of NMOS transistor 312, which is formed in P-well 340. A P-well tap 349 is connected to ground, as is the drain terminal 351. The source terminal 352 is connected to the drain terminal of NMOS transistor 310, as shown in FIG. 3A.

A P$^+$-type substrate 360 is used in this example, but an N$^+$-type substrate is alternatively used with appropriate modification of the well and tub conductivity (doping) types. A P$^+$-type substrate is also used in alternative embodiments of shielded or unshielded triple-well PMOS structures.

N-well 338, also known as an N-type tub, is formed substantially over a P-type epitaxial layer 362 and incorporates an N$^+$ buried layer 370. An N-well tap (N-type tub tap) 364 is connected to a positive voltage, such as Vdd. The N-well tub is not shown in FIG. 3A. Generally, the NMOS transistor 312 of FIG. 3A is formed in a first P-well 340 within a first N-type tub, which forms a P-N junction (not separately shown) between the N-well 338 and the P-well 340. The P-N junction blocks current flow from the P-well into the bulk silicon 360. The N-well 338 is also referred to as a tub N-tub 362, which isolates the bulk silicon from the transistor, and the transistor from the other transistors in the memory cell. Triple-well techniques are generally disfavored for CMOS ICs due to the extra process steps, additional mask, and slow device response (speed); however, triple-well techniques used in memory cells according to embodiments provide single-event upset tolerance, even with closely spaced nodes. The slower device speed arising from triple-well shielding is acceptable in memory cell applications, whereas it would be generally in more speed-critical applications.

An Exemplary CMOS Triple-Well Structure

Figure 3C:
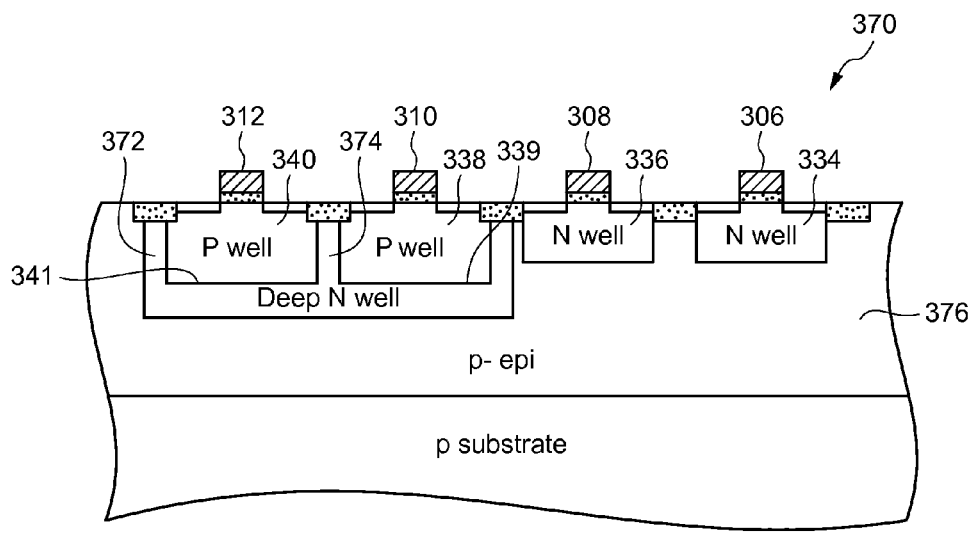
FIG. 3C is a cross section of a CMOS portion of a memory cell according to an embodiment.

FIG. 3C is a cross section of a CMOS portion of a memory cell 370 according to an embodiment. Two NMOS transistors 310, 312 are formed in separate P wells 338, 340 inside N-type tubs 339, 341 formed from a deep N-well structure 372 and sharing an intervening N-type separator 374 between the P-well 338 and the P-well 340. Alternatively, two completely separate N-type tubs are formed and P-wells are formed within the completely separate tubs. The deep N-well structure has a tap (not shown, see FIG. 3B, ref. num. 364). Embodiments having two completely separate deep N-wells (tubs) have separate associated taps. The separate biasing of the N-type tub(s) and P-wells forms a P-N junction between the well and the tub so that charge formed in the well does not flow into the body of the wafer, but rather is dissipated through the well tap. The substrate is also typically biased, which forms another P-N junction between the P-type epitaxial layer 376 and the N-type tub(s).

The CMOS cross section 370 also shows two PMOS devices 306, 308 having separate N-wells 334, 336. P-N junctions form between the N-wells 306, 308 and the P-type epitaxial material 376. Each well 334, 336, 338, 340 is electrically isolated from each other well and from the epitaxial semiconductor layer and bulk semiconductor by at least one P-N junction that confines charge generated in that well by a high-energy particle to be dissipated through an associated well tap. As used herein, "isolated" means wells are isolated from each other within the wafer so that current does not flow between them. In practice, the wells may be electrically coupled to a similar current source or sink through their well taps.

Dissipation through the well tap connections avoids accumulating charge in the native epitaxial layer or bulk semiconductor, which might otherwise affect adjacent transistors and cause a data upset event from a high-energy particle. No transistor in the memory cell shares a well with any other transistor in the memory cell. In alternative embodiments, some transistors, such as access transistors, share wells with other access transistors not associated with the same memory cell.

FIG. 4 is a layout of an SEU tolerant memory cell 400 according to another embodiment of the invention. The memory cell 400 is essentially similar to the memory cell of FIG. 3A in that the memory cell 400 has a plurality of transistors connected so as to restore a data value to a node of the memory cell to an initial value following an event upsetting the initial value. Basically, NMOS devices are in parallel with PMOS devices, rather than having the NMOS devices and PMOS devices in series. Isolated wells 430, 432, 434, 436, 438, 440, 442, 444, 446, 448 for each of the transistors 402, 404, 406, 408, 410, 412, 414, 416, 417, 419 are provided using triple-well techniques, as described above in reference to FIGS. 3A and 3B. Each well has a well tap (e.g., well tap, the other well taps are shown without reference numerals for clarity of illustration, see also, FIG. 3B, ref. nums. 349, 364) connected to a current source or sink to dissipate charge formed in the well upon impact of an energetic particle.

Node 418 does not collect charge from an upset event because of the zero voltage (i.e., connection) between the drain of NMOS transistor 406 and its well, and similarly between the source of PMOS transistor 404 and its well. The same occurs for node 420 due to the biasing and well isolation of transistors 412 and 414. The wells for transistors 404, 406, 412, 414 are isolated from the wells of each other transistor in the memory cell 400 by at least one P-N junction.

In operation, a data value D that turns PMOS transistors 402, 404 OFF is simultaneously provided with a data-bar value D_b that turns PMOS transistors 410, 412 ON (and vice versa). Turning PMOS transistors 410 and 4120N couples Vdd to node 420 through PMOS transistor 410 and also couples node 422 to Vdd through PMOS transistor 412. Coupling Vdd to node 422 turns NMOS transistors 406 and 408 ON, which couples nodes 424 and 418 to ground. Thus, Q_b is essentially at ground potential, and Q is essentially at Vdd.

While the present invention has been described in connection with specific embodiments, variations of these embodiments will be obvious to those of ordinary skill in the art. Therefore, the spirit and scope of the appended claims should not be limited to the foregoing description.

The invention claimed is:

1. A memory cell comprising:
a plurality of transistors connected so as to restore a data value to a node of the memory cell to an initial value following an event upsetting the initial value, the plurality of transistors comprising:
   a first transistor of a first type in a first well of a second type having a first well tap connected to a source of the first transistor;
   a second transistor of the first type in a second well of the second type having a second well tap connected to a source of the second transistor;
   a third transistor of the second type in a third well of the first type having a third well tap connected to a source of the third transistor; and
   a fourth transistor of the second type in a fourth well of the first type having a fourth well tap connected to a source of the fourth transistor, the first well, second well, third well, and forth well being isolated from each other.

2. The memory cell of claim 1 wherein the first transistor, the second storage transistor, the third storage transistor, and the fourth storage transistor are configured to operate as a first inverter circuit.

3. The memory cell of claim 1 wherein the first well is formed in a first tub of the first type so as to form a first P-N junction between the first well and the first tub and the second well is formed in a second tub of the first type so as to form a second P-N junction between the second well and the second tub.

4. The memory cell of claim 3 wherein the first tub a P-type tub and the first well is an N-type well.

5. The memory cell of claim 3 further comprising a separator common to the first tub and to the second tub.

6. The memory cell of claim 1 wherein at least one of the first transistor, second transistor, third transistor and fourth transistor is a shielded transistor.

7. The memory cell of claim 1 further comprising an access transistor formed in a fifth well having a fifth well tap.

8. The memory cell of claim 1 wherein the first transistor is connected in series with the second transistor and the third transistor is connected in series with the fourth transistor.

9. The memory cell of claim 1 wherein the first transistor is connected in parallel with the second transistor.

10. The memory cell of claim 1 further comprising:
a fifth transistor of the first type in a fifth well of the second type having a fifth well tap connected to a source of the fifth transistor;
a sixth transistor of the first type in a sixth well of the second type having a sixth well tap connected to a source of the sixth transistor;
a seventh storage transistor of the second type in a seventh well of the first type having a seventh well tap connected to a source of the seventh transistor; and
an eighth storage transistor of the second type in an eighth well of the first type having an eighth well tap connected to a source of the eighth transistor, the fifth well, sixth well, seventh well and eighth well being isolated from each other and from each of the first well, the second well, the third well and the fourth well.

11. The memory cell of claim 10 wherein the first transistor, the second transistor, the third transistor, and the fourth transistor are configured to operate as a first inverter circuit and the fifth transistor, the sixth transistor, the seventh transistor a second tub.

12. The memory cell of claim 10 wherein the first transistor is connected in series with the second transistor and the fifth transistor is connected in series with the sixth transistor.

13. The memory cell of claim 10 wherein the first transistor is connected in parallel with the second transistor.

14. The memory cell of claim 10 further comprising
a first tub; and
a second tub.

15. The memory cell of claim 14 further comprising a separator common to the first tub and the second tub.

16. The memory cell of claim 1, wherein:
the first and second well taps are electrically coupled to a positive supply voltage; and
the third and forth well taps are electrically coupled to a ground voltage.

17. A memory cell, comprising:
a first inverter including a first, a second, a third, and a fourth transistor, the first transistor serially connected to the second transistor, the third transistor serially connected to the fourth transistor, and the second transistor coupled to the third transistor;
a second inverter cross-coupled to the first inverter to provide redundant storage and including a fifth, a sixth, a seventh, and an eighth transistor, the fifth transistor serially connected to the sixth transistor, the seventh transistor serially connected to the eighth transistor, and the sixth transistor coupled to the seventh transistor;
wherein each of the first, second, fifth, and sixth transistors are of a first type and have respective well taps connected to respective sources of the transistors, and each of the third, fourth, seventh, and eighth transistors are of a second type and have respective well taps connected to respective sources of the transistors; and
wherein each of the first, second, fifth, and sixth transistors are in respective wells of the second type, each of the third, fourth, seventh, and eighth transistors are in respective wells of the first type, and the respective wells are electrically isolated from one another.

18. The memory cell of claim 17, wherein the second and third transistors are coupled in series, and the sixth and seventh transistors are coupled in series.

19. The memory cell of claim 17, wherein the second and third transistors are coupled in parallel, and the sixth and seventh transistors are coupled in parallel.

* * * * *